US012218100B2

(12) United States Patent
Hwang et al.

(10) Patent No.: US 12,218,100 B2
(45) Date of Patent: Feb. 4, 2025

(54) SEMICONDUCTOR PACKAGE

(71) Applicant: SAMSUNG ELECTRONICS CO., LTD., Suwon-si (KR)

(72) Inventors: Inhyo Hwang, Asan-si (KR); Young Lyong Kim, Anyang-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 310 days.

(21) Appl. No.: 17/680,617

(22) Filed: Feb. 25, 2022

(65) Prior Publication Data

US 2023/0047345 A1 Feb. 16, 2023

(30) Foreign Application Priority Data

Aug. 13, 2021 (KR) .................... 10-2021-0107450

(51) Int. Cl.
*H01L 25/065* (2023.01)
*H01L 23/498* (2006.01)
*H01L 23/00* (2006.01)

(52) U.S. Cl.
CPC .... *H01L 25/0657* (2013.01); *H01L 23/49822* (2013.01); *H01L 24/16* (2013.01); *H01L 24/17* (2013.01); *H01L 25/0652* (2013.01); *H01L 2224/16145* (2013.01); *H01L 2224/16227* (2013.01); *H01L 2224/17181* (2013.01); *H01L 2224/17183* (2013.01); *H01L 2225/06513* (2013.01); *H01L 2225/06517* (2013.01); *H01L 2225/06562* (2013.01)

(58) Field of Classification Search
None
See application file for complete search history.

(56) References Cited

U.S. PATENT DOCUMENTS

| | | | |
|---|---|---|---|
| 6,970,362 B1 | 11/2005 | Chakravorty | |
| 7,825,504 B2 | 11/2010 | Kim | |
| 9,123,630 B2 | 9/2015 | Kim et al. | |
| 9,711,482 B2 | 7/2017 | Lee et al. | |
| 11,710,693 B2* | 7/2023 | Shih | H01L 21/486 257/668 |
| 2016/0192488 A1 | 6/2016 | Min et al. | |
| 2016/0260695 A1* | 9/2016 | Chung | H01L 23/34 |
| 2022/0045008 A1* | 2/2022 | Kang | H01L 23/5385 |
| 2022/0310577 A1* | 9/2022 | Lee | H01L 25/0652 |
| 2023/0023883 A1* | 1/2023 | Chung | H01L 25/0652 |

FOREIGN PATENT DOCUMENTS

| | | |
|---|---|---|
| JP | 2006-310649 A | 11/2006 |
| KR | 10-2004-0021698 A | 3/2004 |

* cited by examiner

*Primary Examiner* — Long Pham
(74) *Attorney, Agent, or Firm* — Sughrue Mion, PLLC

(57) ABSTRACT

Provided is a semiconductor package including a first semiconductor chip provided on a package substrate, an interconnection substrate provided on the package substrate, the interconnection substrate having a side surface facing the first semiconductor chip, and a second semiconductor chip provided on the interconnection substrate and extended to a region on a top surface of the first semiconductor chip, wherein the interconnection substrate includes a lower interconnection layer facing the package substrate, an upper interconnection layer facing the first semiconductor chip, and a passive device between the lower interconnection layer and the upper interconnection layer, and wherein the passive device is electrically connected to the second semiconductor chip.

20 Claims, 14 Drawing Sheets

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2021-0107450, filed on Aug. 13, 2021, in the Korean Intellectual Property Office, the entirety of which is hereby incorporated by reference.

BACKGROUND

Example embodiments of the present disclosure relate to a semiconductor package.

Recently, demand for portable electronic devices is rapidly increasing in the market, and thus, in electronic components included in the portable electronic devices, it is necessary to realize the characteristics of high performance, and small size, and small weight. Especially, for memory semiconductor devices, it is necessary to realize the characteristics of high performance, high bandwidth, and high processing capacity. To reduce the size and weight of the electronic component, it is necessary to develop a technology of reducing a size of each component and a packaging technology of integrating several components in a single package. In particular, for a semiconductor package used to process high frequency signals, it is necessary not only to reduce a size of a product but also to realize good electrical characteristics.

In general, a through-silicon via (TSV) process, a flip chip process, a wire bonding process, or the like is used to stack a plurality of memory chips on a package substrate. However, the TSV process suffers from high complexity and high cost, and thus, it is necessary to develop a technology capable of overcoming the difficulties in the TSV process.

SUMMARY

One or more example embodiments provide a semiconductor package with improved structural stability.

One or more example embodiments provide a semiconductor package with improved electric characteristics.

One or more example embodiments provide a semiconductor package with a reduced size.

According to an aspect of an example embodiment, there is provided a semiconductor package including a first semiconductor chip provided on a package substrate, an interconnection substrate provided on the package substrate, the interconnection substrate having a side surface facing the first semiconductor chip, and a second semiconductor chip provided on the interconnection substrate and extended to a region on a top surface of the first semiconductor chip, wherein the interconnection substrate includes a lower interconnection layer facing the package substrate, an upper interconnection layer facing the first semiconductor chip, and a passive device between the lower interconnection layer and the upper interconnection layer, and wherein the passive device is electrically connected to the second semiconductor chip.

According to another aspect of an example embodiment, there is provided a semiconductor package, including a package substrate having a top surface, an upper pad provided on the top surface of the package substrate, a first semiconductor chip provided on the top surface of the package substrate, a second semiconductor chip provided on a top surface of the first semiconductor chip, a chip pad is provided on the bottom surface of the second semiconductor chip, and an interconnection substrate having a first surface facing the upper pad and a second surface facing the chip pad, wherein the interconnection substrate includes a passive device between the first surface and the second surface, and wherein the passive device includes a first electrode electrically connected to the upper pad, a second electrode electrically connected to the chip pad, and a dielectric material between the first electrode and the second electrode According to another aspect of an example embodiment, there is provided a semiconductor package including a package substrate having a bottom surface and a top surface, outer pads provided on the bottom surface of the package substrate, upper pads provided on the top surface of the package substrate, a first semiconductor chip having first chip pads which are provided to face the upper pads, first solder patterns between the upper pads and the first chip pads, an interconnection substrate including a lower interconnection layer including first connection pads facing the upper pads, a core layer provided on the lower interconnection layer and including a passive device, and an upper interconnection layer provided on the core layer and including second connection pads, second solder patterns between the upper pads and the first connection pads, a second semiconductor chip including second chip pads, which are provided to face the second connection pads, and dummy pads, which are provided to face a top surface of the first semiconductor chip, third solder patterns between the second connection pads and the second chip pads, fourth solder patterns between the dummy pads and a top surface of the second semiconductor chip, and a mold layer provided on the top surface of the package substrate and provided on the first semiconductor chip, the interconnection substrate, and the second semiconductor chip, wherein the passive device is electrically connected to the second chip pads.

BRIEF DESCRIPTION OF THE DRAWINGS

The above and/or other aspects, features, and advantages of certain example embodiments will be more apparent from the following description taken in conjunction with the accompanying drawings, in which.

DETAILED DESCRIPTION

Example embodiments of the inventive concepts will now be described more fully with reference to the accompanying drawings, in which example embodiments are shown.

Figure 1A:
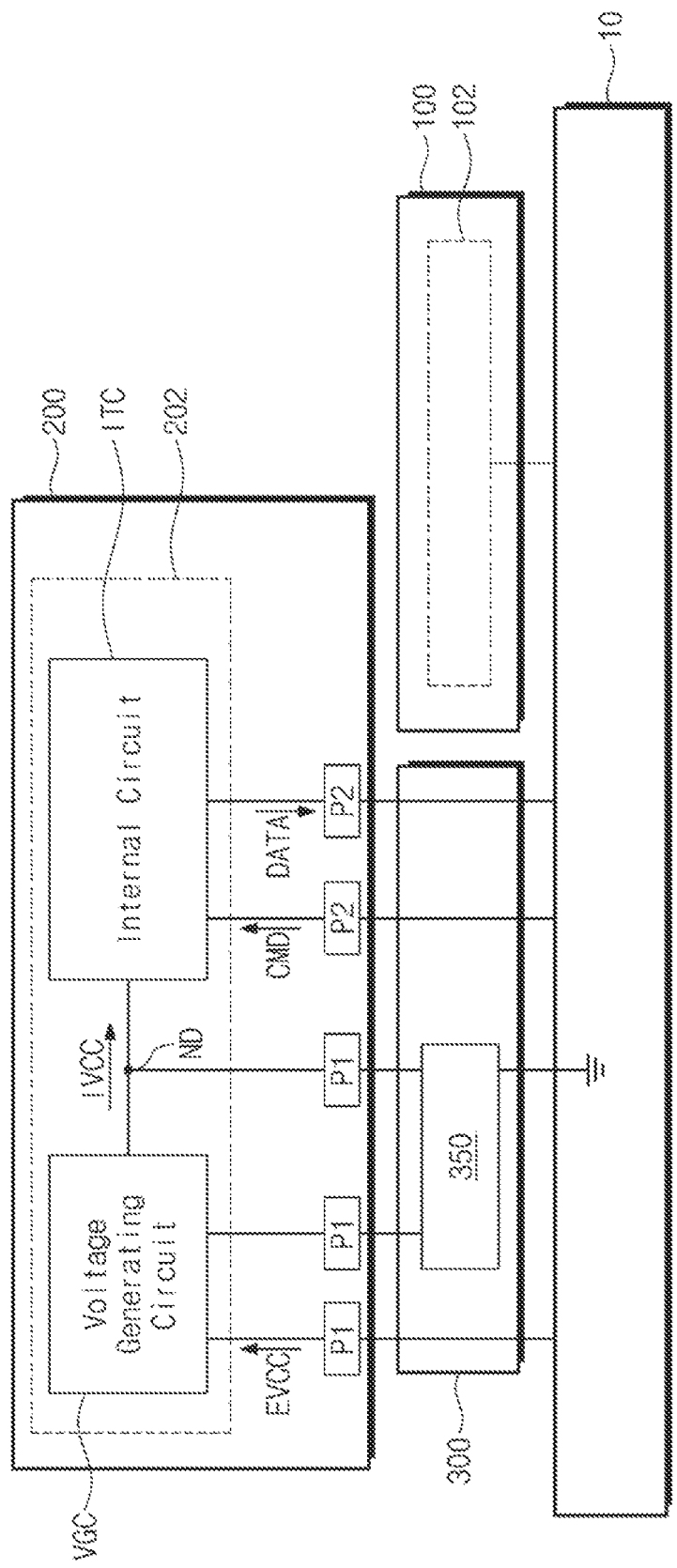
FIGS. 1A and 1B are schematic block diagrams, each of which illustrates a semiconductor package according to an example embodiment.
Figure 1B:
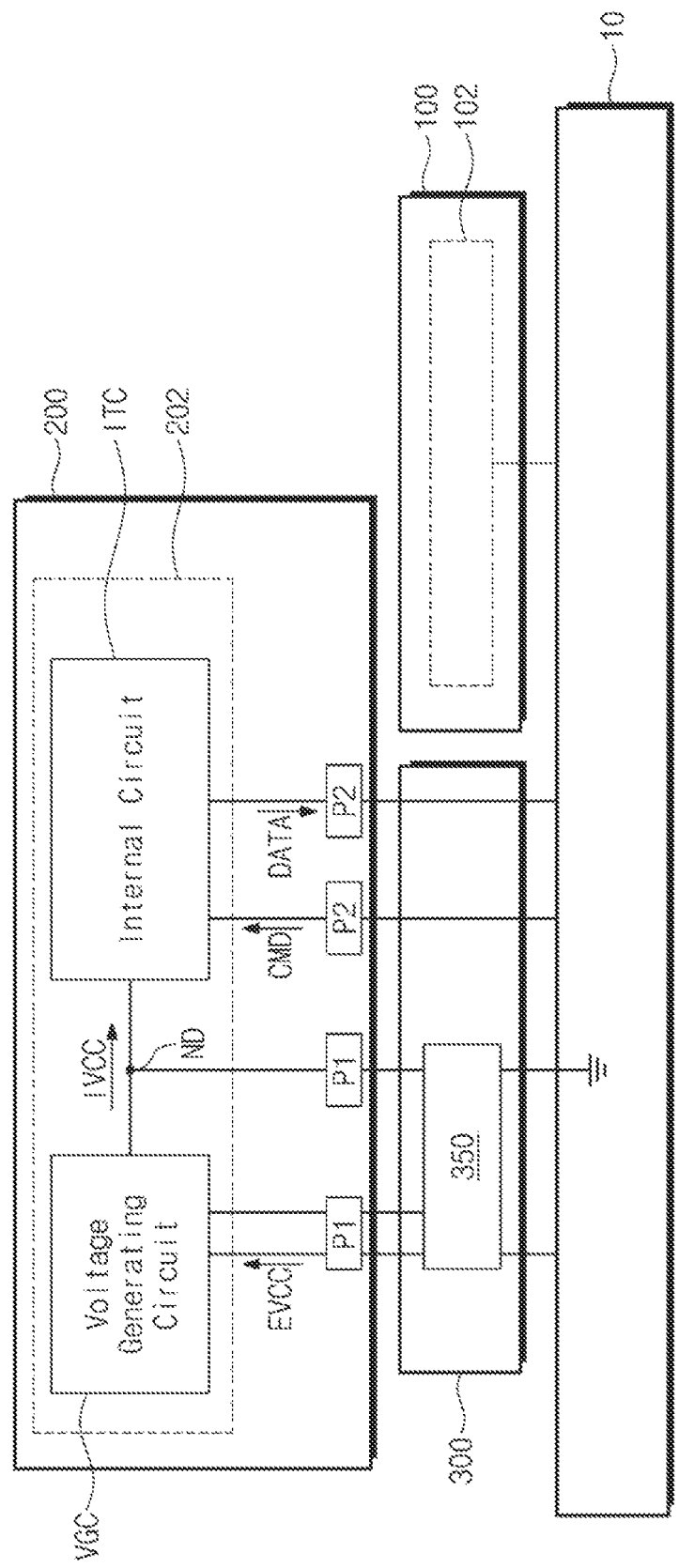

FIGS. 1A and 1B are schematic block diagrams, each of which illustrates a semiconductor package according to an example embodiment.

Referring to FIG. 1A, a semiconductor package may include a package substrate 10, a first semiconductor chip 100, a second semiconductor chip 200, and an interconnection substrate 300. At least one of the first semiconductor chip 100 and the second semiconductor chip 200 may be a memory chip (e.g., a DRAM, SRAM, MRAM, or FLASH memory chip). According to another example embodiment, at least one of the first semiconductor chip 100 and the second semiconductor chip 200 may be a logic chip. The first semiconductor chip 100 and the second semiconductor chip 200 may include a first integrated circuit 102 and a second integrated circuit 202, respectively. The first integrated circuit 102 may be directly connected to the package substrate 10. The second integrated circuit 202 may be connected to the package substrate 10 through the interconnection substrate 300.

The second integrated circuit 202 of the second semiconductor chip 200 may include a voltage generating circuit VGC and an internal circuit ITC. The voltage generating circuit VGC may be electrically connected to an external device through power terminals P1. The voltage generating circuit VGC may receive an external power voltage EVCC through the interconnection substrate 300 and the power terminals P1. The voltage generating circuit VGC may control the received external power voltage EVCC to provide an internal voltage IVCC for an operation of the internal circuit ITC to the internal circuit ITC. The internal circuit ITC may be electrically connected to an external device through signal terminals P2. The internal circuit ITC may receive a command signal CMD from a host, which is placed inside or outside of the semiconductor package, and may output a data signal DATA, which is processed thereby or stored therein. The command signal CMD may be transmitted from the package substrate 10 through the interconnection substrate 300 and the signal terminals P2. The data signal DATA may be output to the package substrate 10 through the signal terminals P2 and the interconnection substrate 300.

In an example embodiment, the second semiconductor chip 200 may be a memory chip. The internal circuit ITC of the second semiconductor chip 200 may include a memory cell array, a decoder circuit, and an input/output circuit. The signal terminals P2 may be electrically connected to the input/output circuit.

The interconnection substrate 300 may include a passive device 350 which is electrically connected to the package substrate 10 and the second semiconductor chip 200. The passive device 350 may not have an active function, such as amplifying or converting an electric signal. The passive device 350 may include at least one of, for example, a capacitor, a resistor, an inductor, a transformer, and a relay. The passive device 350 may be connected to the voltage generating circuit VGC through the power terminals P1. In addition, the passive device 350 may be connected to a node ND between the voltage generating circuit VGC and the internal circuit ITC. A passive device 350 may be connected to the package substrate 10 and may be grounded. The passive device 350 may be configured to improve power integrity of the semiconductor package. For example, the passive device 350 may be used to remove a noise component included in the external power voltage EVCC, which is input to the voltage generating circuit VGC, or in the internal voltage IVCC, which is output from the voltage generating circuit VGC. In an example embodiment, the passive device 350 may be configured to store an electric energy and to compensate the external power voltage EVCC and the internal voltage IVCC.

In an example embodiment, the passive device 350 may be connected in parallel to the voltage generating circuit VGC, as shown in FIG. 1B. The external power voltage EVCC may be provided to the voltage generating circuit VGC through the passive device 350. The passive device 350 may include, for example, a decoupling capacitor.

Figure 2:
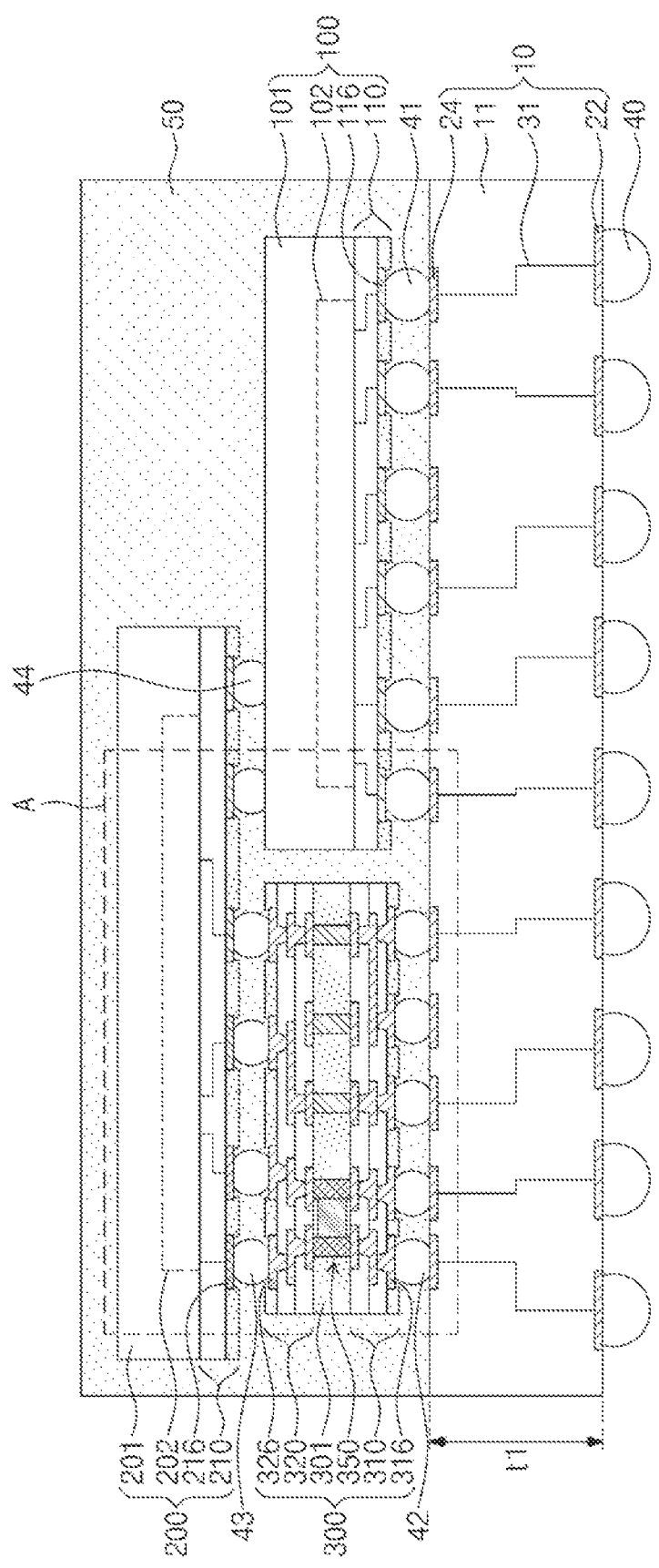
FIG. 2 is a sectional view illustrating a semiconductor package according to an example embodiment.
Figure 3:
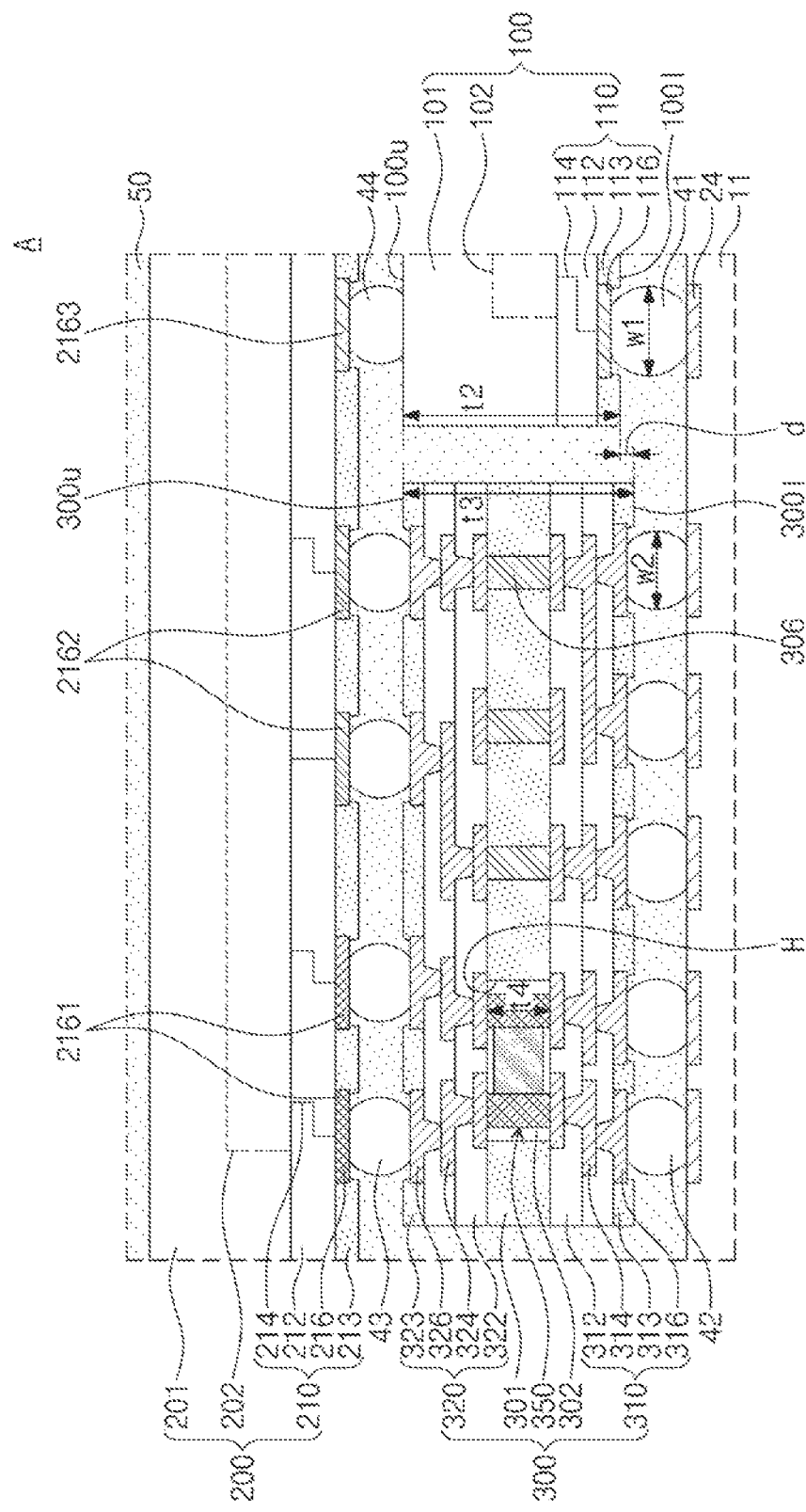
FIG. 3 is an enlarged sectional view illustrating a portion A of FIG. 2.
Figure 4:
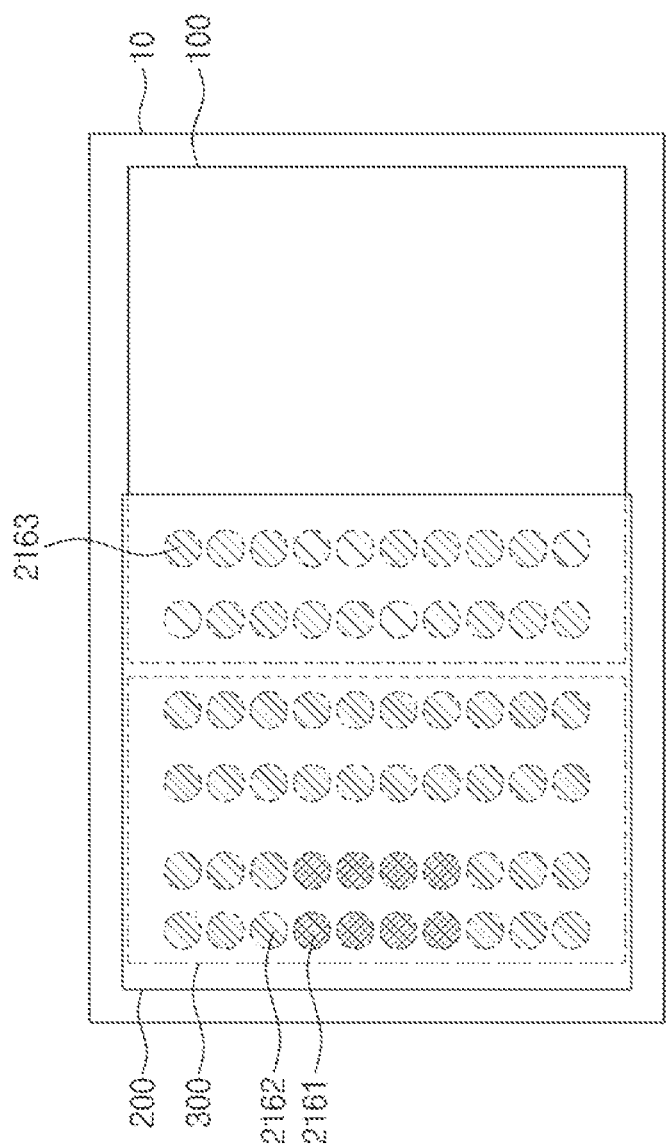
FIG. 4 is a plan view illustrating a semiconductor package according to an example embodiment.
Figure 5:
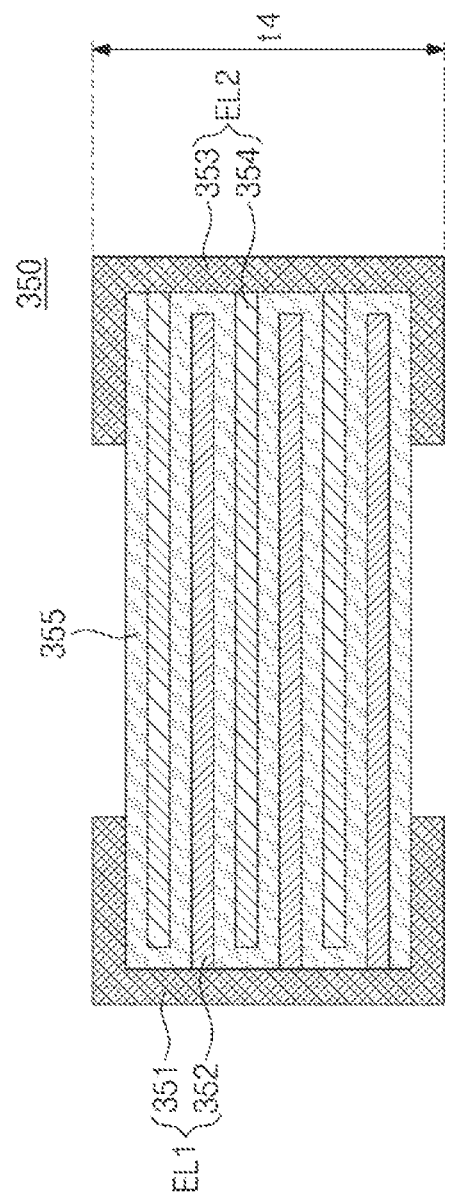
FIG. 5 is a sectional view illustrating a passive device according to an example embodiment.

FIG. 2 is a sectional view illustrating a semiconductor package according to an example embodiment. FIG. 3 is an enlarged sectional view illustrating a portion A of FIG. 2. FIG. 4 is a plan view illustrating a semiconductor package according to an example embodiment. FIG. 5 is a sectional view illustrating a passive device according to an example embodiment.

Referring to FIG. 2, the package substrate 10 may include an insulating layer 11, outer pads 22, upper pads 24, and a substrate interconnection pattern 31. The package substrate 10 may have a bottom surface, on which the outer pads 22 are formed, and a top surface, on which the upper pads 24 are formed. The outer pads 22 and the upper pads 24 may be electrically connected to each other through the substrate interconnection pattern 31 in the insulating layer 11. In an example embodiment, the outer pads 22 may be arranged to have a pitch different from the upper pads 24, and the number of the outer pads 22 may be different from that of the upper pads 24. The package substrate 10 may be a redistribution substrate.

The insulating layer 11 may be formed of or include an organic material such as a photosensitive insulating or photo-imageable dielectric material. The photosensitive insulating material may be polymeric materials. For example, the photosensitive insulating material may include at least one of photosensitive polyimide, polybenzoxazole, phenol-based polymers, and benzocyclobutene-based polymers. The insulating layer 11 may have a multi-layered structure which is formed by repeatedly stacking insulating materials. For example, the package substrate 10 may include a plurality of insulating layers 11. The insulating layers 11 may be integrally formed of or include the same material. For example, there may be no observable interface between adjacent ones of the insulating layers 11. The substrate interconnection pattern 31 may include horizontal line portions, which are disposed between the insulating layers 11 to transmit electric signals in a horizontal direction, and via portions, which are used to transmit the electric signals between the horizontal line portions. The substrate interconnection pattern 31 may be formed of or include at least one of metallic materials (e.g., copper (Cu)).

Referring to FIGS. 1A and 2, the outer pads 22 may include power pads, ground pads, and signal pads. At least one of the power pads may be configured to receive the external power voltage EVCC and to deliver the external power voltage EVCC to the upper pads 24. At least one of the power pads may be grounded. Some of the signal pads may be configured to receive the command signal CMD and to deliver the command signal CMD to the upper pads 24. The others of the signal pads may be configured to receive the data signal DATA from the upper pads 24. The outer pads 22 and the upper pads 24 may be formed of or include at least one of metallic materials (e.g., copper (Cu) and aluminum (Al)).

Outer terminals 40 may be provided on bottom surfaces of the outer pads 22, respectively. The outer terminals 40 may include solder balls or solder bumps. The outer pads 22 may include a solder material. The solder material may include, for example, tin (Sn), bismuth (Bi), lead (Pb), silver (Ag), or alloys thereof.

Referring to FIGS. 2 and 3, the first semiconductor chip 100 may be disposed on a top surface of the package substrate 10. The first semiconductor chip 100 may include a first base layer 101, in which the first integrated circuit 102 is formed, and a first chip interconnection layer 110, which is connected to the first integrated circuit 102. The first base layer 101 may be formed of or include a semiconductor material (e.g., silicon (Si)). The first semiconductor chip 100 may be mounted on the top surface of the package substrate 10 in a flip-chip manner. For example, the first semiconductor chip 100 may have a bottom surface, on which first chip pads 116 are formed, and the first chip pads 116 may be provided to face the upper pads 24 of the package substrate 10. The first chip pads 116 may be electrically connected to the upper pads 24, respectively. The first integrated circuit 102 may be formed in a lower portion of the first base layer 101 and may be electrically connected to the first chip pads 116. A bottom surface of the first semiconductor chip 100 may be an active surface of the first semiconductor chip 100. A top surface of the first semiconductor chip 100 may be an inactive surface of the first semiconductor chip 100.

The first chip interconnection layer 110 may include a first insulating layer 112, a first chip passivation layer 113, a first chip interconnection pattern 114, and the first chip pads 116, as shown in FIG. 3. The first insulating layer 112 may be disposed on a bottom surface of the first base layer 101. The first insulating layer 112 may have a multi-layered structure which is formed by repeatedly stacking insulating materials. For example, the first semiconductor chip 100 may include a plurality of first insulating layers 112. The first insulating layers 112 may be integrally formed of or include the same material. For example, there may be no observable interface between adjacent ones of the first insulating layers 112. The first insulating layer 112 may be formed of or include at least one of silicon oxide (SiO), silicon nitride (SiN), or silicon oxynitride (SiON).

The first chip interconnection pattern 114 may be provided in the first insulating layer 112 to electrically connect the first integrated circuit 102 to the first chip pads 116. The first chip interconnection pattern 114 may be formed of or include a metallic material (e.g., copper (Cu)). The first chip interconnection pattern 114 may include horizontal line portions, which are disposed between the first insulating layers 112 to transmit electric signals in a horizontal direction, and via portions, which are used to transmit the electric signals between the horizontal line portions.

The first chip pads 116 may be horizontally arranged on a bottom surface of the first insulating layer 112. Here, the first chip pads 116 may be arranged to form one column or to form a plurality of columns. For example, the first chip pads 116 may be arranged in a grid shape (i.e., in a plurality of columns and a plurality of rows) or in a honeycomb shape. In an example embodiment, the first chip pads 116 may be arranged to have at least two different pitches. For example, the arrangement of the first chip pads 116 may be variously changed depending on an integration density and positions of the interconnection lines in the first semiconductor chip 100. The first chip pads 116 may be formed of or include at least one of metallic materials (e.g., aluminum (Al) and copper (Cu)).

The first chip passivation layer 113 may be provided on the bottom surface of the first insulating layer 112. The first chip passivation layer 113 may be provided on the bottom surface of the first insulating layer 112 to be disposed on and cover the first chip pads 116, but the first chip passivation layer 113 may have openings, which are formed to at least partially expose surfaces of the first chip pads 116. The first chip passivation layer 113 may be formed of or include a photosensitive polymer (e.g., a photosensitive polyimide).

First solder patterns 41 may be provided between the package substrate 10 and the first semiconductor chip 100. The first solder patterns 41 may electrically connect the first chip pads 116 of the first semiconductor chip 100 to the upper pads 24 of the package substrate 10. The first solder patterns 41 may include solder balls or solder bumps.

Referring back to FIGS. 2 and 3, the interconnection substrate 300 may be provided on the top surface of the package substrate 10. The interconnection substrate 300 may have a bottom surface 300*l*, which faces the upper pads 24, and a top surface 300*u*, which faces second chip pads 216 of the second semiconductor chip 200. The bottom surface 300*l* of the interconnection substrate 300 may be referred to as a first surface, and the top surface 300*u* of the interconnection substrate 300 may be referred to as a second surface. The interconnection substrate 300 may include a lower interconnection layer 310, a core layer 301, the passive device 350, and an upper interconnection layer 320. The core layer 301 may be disposed between the lower interconnection layer 310 and the upper interconnection layer 320. The passive device 350 may be disposed in the core layer 301 to electrically connect the lower interconnection layer 310 to the upper interconnection layer 320.

The lower interconnection layer 310 may include lower insulating layers 312, a lower passivation layer 313, a lower interconnection pattern 314, and first connection pads 316. The lower insulating layers 312 may be stacked on a bottom surface of the core layer 301. The lower insulating layers 312 may be integrally formed of or include the same material. The lower insulating layers 312 may be formed of or include at least one of thermosetting resins (e.g., epoxy resin) or thermoplastic resins (e.g., polyimide). The lower insulating layers 312 may further include a reinforcing material (e.g., a glass fiber and an inorganic filler). The reinforcing material may be formed of or include, for example, prepreg and Ajinomoto build-up film (ABF). In an example embodiment, and the lower insulating layers 312 may be formed of or include an organic material such as a photosensitive insulating or photo-imageable dielectric material. The photosensitive insulating material may be polymeric materials. For example, the photosensitive insulating material may include at least one of photosensitive polyimide, polybenzoxazole, phenol-based polymers, and benzocyclobutene-based polymers.

The lower interconnection patterns 314 may be provided in the lower insulating layer 312 and may be electrically connected to the passive device 350, which is disposed in the core layer 301, and conductive pillars 306. The lower interconnection pattern 314 may be formed of or include a metallic material (e.g., copper (Cu)). The lower interconnection pattern 314 may include horizontal line portions, which are disposed between the lower insulating layers 312 to transmit electric signals in a horizontal direction, and via portions, which are used to transmit the electric signals between the horizontal line portions. The via portions may protrude from the horizontal line portions in a direction toward the core layer 301.

The first connection pads 316 may be horizontally arranged on a bottom surface of the lower insulating layer 312. The first connection pads 316 may be electrically connected to the lower interconnection pattern 314 through the via portions. The first connection pads 316 may be arranged to form one column or to form a plurality of columns. The first connection pads 316 may be arranged to have a pitch different from second connection pads 326, which will be described below, and the number of the first connection pads 316 may be different from that of the second connection pads 326. The first connection pads 316 may be formed of or include at least one of metallic materials (e.g., copper (Cu)).

The lower passivation layer 313 may be provided on the bottom surface of the lower insulating layer 312. The lower passivation layer 313 may be provided on the bottom surface of the lower insulating layer 312 to be disposed on and cover the first connection pads 316, but the lower passivation layer 313 may have openings, which are formed to at least partially expose surfaces of the first connection pads 316. The lower passivation layer 313 may be formed of or include at least one of ABF, solder resist, and a photosensitive polymer (e.g., a photosensitive polyimide).

The core layer 301 may be disposed on a top surface of the lower insulating layer 312. The core layer 301 may be formed of or include at least one of insulating materials. The core layer 301 may have a thickness larger than each of the lower insulating layer 312 and the upper insulating layer 322. The core layer 301 may be formed of or include at least one of thermosetting resins (e.g., epoxy resin) or thermoplastic resins (e.g., polyimide). The core layer 301 may further include a reinforcing material (e.g., a glass fiber and an inorganic filler). The reinforcing material may include, for example, prepreg, ABF, and so forth. The core layer 301 may include one of, for example, a ceramic plate, a liquid crystal polymer (LCP), a glass plate, a copper clad laminate (CCL), or an unclad CCL. In an example embodiment, the core layer 301 may be formed of or include a material that is different from the lower insulating layers 312 and the upper insulating layers 322.

The upper interconnection layer 320 may be disposed on a top surface of the core layer 301. The upper interconnection layer 320 may include the upper insulating layers 322, an upper passivation layer 323, an upper interconnection pattern 324, and second connection pads 326. The upper insulating layers 322 may be stacked on the top surface of the core layer 301. The upper insulating layers 322 may be formed of or include the same material. The upper insulating layers 322 may be formed of or include at least one of thermosetting resins (e.g., epoxy resin) or thermoplastic resins (e.g., polyimide). The upper insulating layers 322 may further include a reinforcing material (e.g., a glass fiber and an inorganic filler). The reinforcing material may include, for example, prepreg, ABF, and so forth. In an embodiment, and the upper insulating layers 322 may be formed of or include an organic material such as a photosensitive insulating or photo-imageable dielectric material. The photosensitive insulating material may be polymeric materials. For example, the photosensitive insulating material may include at least one of photosensitive polyimide, polybenzoxazole, phenol-based polymers, and benzocyclobutene-based polymers.

The upper interconnection patterns 324 may be provided in the upper insulating layer 322 and may be electrically connected to the passive device 350, which is disposed in the core layer 301, and the conductive pillars 306. The upper interconnection pattern 324 may be formed of or include at least one of metallic materials (e.g., copper (Cu)). The upper interconnection pattern 324 may include horizontal line portions, which are disposed between the upper insulating layers 322 to transmit electric signals in a horizontal direction, and via portions, which are used to transmit the electric signals between the horizontal line portions. The via portions may protrude from the horizontal line portions in a direction toward the core layer 301.

The second connection pads 326 may be horizontally arranged on a top surface of the upper insulating layer 322. The second connection pads 326 may be electrically connected to the upper interconnection pattern 324 through the via portions. The second connection pads 326 may be arranged to form one column or to form a plurality of columns. The second connection pads 326 may be formed of or include at least one of metallic materials (e.g., copper (Cu)).

The upper passivation layer 323 may be provided on the top surface of the upper insulating layer 322. The upper passivation layer 323 may be provided on the top surface of the upper insulating layer 322 to be disposed on and cover the second connection pads 326, but the upper passivation layer 323 may have openings, which are formed to at least partially expose surfaces of the second connection pads 326. The upper passivation layer 323 may be formed of or include at least one of ABF, solder resist, and a photosensitive polymer (e.g., a photosensitive polyimide).

The passive device 350 may be disposed in a hole H that is provided to vertically penetrate the core layer 301. The passive device 350 may be electrically connected to the first connection pad 316 through the lower interconnection pattern 314 and may be electrically connected to the second connection pad 326 through the upper interconnection pattern 324. The passive device 350 may be covered with a gap-fill insulating pattern 302, which is provided to fill a remaining portion of the hole H. The gap-fill insulating pattern 302 may be provided to expose at least a portion of each of top and bottom surfaces of the passive device 350.

Referring to FIGS. 1, 3, and 5, the passive device 350 may include a first electrode EL1, a second electrode EL2, and a dielectric material 355 between the first electrode EL1 and the second electrode EL2. The passive device 350 may be a capacitor. The first electrode EL1 and the second electrode EL2 of the passive device 350 may be connected to the voltage generating circuit VGC of the second integrated circuit 202 through the second connection pads 326. For example, the passive device 350 may be connected in parallel to the voltage generating circuit VGC, thereby serving as a bypass capacitor or a decoupling capacitor. At least one of the first electrode EL1 and the second electrode EL2 may be connected to the first connection pad 316 and may be grounded through the package substrate 10.

In an example embodiment, the first electrode EL1 may include a first outer electrode 351 and first inner electrodes 352. The second electrode EL2 may include a second outer electrode 353 and second inner electrodes 354. The first outer electrode 351 and the second outer electrode 353 may be horizontally spaced apart from each other, with the dielectric material 355 interposed therebetween. The first inner electrodes 352 may be connected to the first outer electrode 351 and may be extended toward the second outer electrode 353. The second inner electrodes 354 may be connected to the second outer electrode 353 and may be extended toward the first outer electrode 351. The first inner electrodes 352 and the second inner electrodes 354 may be vertically and alternately stacked. The dielectric material 355 may be interposed between the first inner electrodes 352 and the second inner electrodes 354. The passive device 350 may be, for example, a multi-layer ceramic capacitor (MLCC).

Referring back to FIGS. 2 and 3, second solder patterns 42 may be provided between the package substrate 10 and the interconnection substrate 300. The second solder patterns 42 may electrically connect the first connection pads 316 of the interconnection substrate 300 to the upper pads 24 of the package substrate 10. The second solder patterns 42 may include solder balls or solder bumps.

In an example embodiment, a thickness t3 of the interconnection substrate 300 may be equal to or larger than a thickness t2 of the first semiconductor chip 100. For example, the interconnection substrate 300 may not be thinner than the first semiconductor chip 100. The thickness t2 of the first semiconductor chip 100 may range from 40 μm to 200 μm. The thickness t3 of the interconnection substrate 300 may range from 50 μm to 250 μm. The top surface 300u of the interconnection substrate 300 may be located at the same level as a top surface 100u of the first semiconductor chip 100. Accordingly, it may be possible to prevent the second semiconductor chip 200 from being inclined and to prevent the consequent interconnection failure. In addition, the second semiconductor chip 200 may be more stably supported by the interconnection substrate 300 and the first semiconductor chip 100. The bottom surface 300l of the interconnection substrate 300 may be located at a level lower than a bottom surface 100l of the first semiconductor chip 100. A difference d in level between the bottom surface 300l of the interconnection substrate 300 and the bottom surface 100l of the first semiconductor chip 100 may range from 0.1 μm to 10 μm. Since there is the level difference between the bottom surfaces of the interconnection substrate 300 and the first semiconductor chip 100, the first solder patterns 41 and the second solder patterns 42 may be provided to have different sizes from each other. A width w1 of the first solder patterns 41 may be larger than a width w2 of the second solder patterns 42. The width w1 of the first solder patterns 41 may range from 5 μm to 20 μm. The width w2 of the second solder patterns 42 may range from 3 μm to 15 μm.

The thickness t3 of the interconnection substrate 300 may be smaller than a thickness t1 of the package substrate 10. For example, the thickness t3 of the package substrate 10 may range from 200 μm to 500 μm.

A thickness t4 of the passive device 350 may be 0.1 to 0.3 times the thickness t3 of the interconnection substrate 300. The thickness t4 of the passive device 350 may be substantially equal to a thickness of the core layer 301. In the case where the thickness t4 of the passive device 350 is larger than 0.05 times the thickness t3 of the interconnection substrate 300, the passive device 350 may have a capacitance that is large enough to improve the power integrity of the semiconductor package. Since the thickness t4 of the passive device 350 is smaller than 0.3 times the thickness t3 of the interconnection substrate 300, it may be possible to prevent a failure which is caused by the level difference d between the bottom surface 300l of the interconnection substrate 300 and the bottom surface 100l of the first semiconductor chip 100.

Referring to FIGS. 2 to 4, the second semiconductor chip 200 may be mounted on the interconnection substrate 300. The second semiconductor chip 200 may be extended to a region on the top surface 100u of the first semiconductor chip 100. For example, the second semiconductor chip 200 may be disposed to be partially overlapped with the first semiconductor chip 100. Since the first semiconductor chip 100 and the second semiconductor chip 200 are overlapped with each other, it may be possible to reduce an area of the top surface of the package substrate 10, which is occupied by the first semiconductor chip 100 and the second semiconductor chip 200, and to reduce a size of the semiconductor package.

The second semiconductor chip 200 may include a second base layer 201, in which the second integrated circuit 202 is formed, and a second chip interconnection layer 210, which is connected to the second integrated circuit 202. The second base layer 201 may be formed of or include a semiconductor material (e.g., silicon (Si)). The second semiconductor chip 200 may be mounted on the top surface 300u of the interconnection substrate 300 in a flip-chip manner. In detail, the second semiconductor chip 200 may have a bottom surface, on which the second chip pads 216 are formed, and the second chip pads 216 may be provided to face the second connection pads 326 of the interconnection substrate 300. The second chip pads 216 may be electrically connected to the second connection pads 326, respectively. The second integrated circuit 202 may be formed in a lower portion of the second base layer 201 and may be electrically connected to the second chip pads 216. A bottom surface of the second semiconductor chip 200 may be an active surface of the second semiconductor chip 200. A top surface of the second semiconductor chip 200 may be an inactive surface of the second semiconductor chip 200.

The second chip interconnection layer 210 may include a second insulating layer 212, a second chip passivation layer 213, a second chip interconnection pattern 214, and the second chip pads 216, as shown in FIG. 3. The second insulating layer 212 may be disposed on a bottom surface of the second base layer 201. The second insulating layer 212 may have a multi-layered structure which is formed by repeatedly stacking insulating materials. For example, the second semiconductor chip 200 may include a plurality of second insulating layers 212. The second insulating layers 212 may be formed of or include the same material. For example, there may be no observable interface between adjacent ones of the second insulating layers 212. The second insulating layer 212 may be formed of or include at least one of silicon oxide (SiO), silicon nitride (SiN), or silicon oxynitride (SiON).

The second chip interconnection pattern 214 may be provided in the second insulating layer 212 to electrically connect the second integrated circuit 202 to the second chip pads 216. The second chip interconnection pattern 214 may be formed of or include at least one of metallic materials (e.g., copper (Cu)). The second chip interconnection pattern 214 may include horizontal line portions, which are disposed between the second insulating layers 212 to transmit electric signals in a horizontal direction, and via portions, which are used to transmit the electric signals between the horizontal line portions.

The second chip pads 216 may be horizontally arranged on a bottom surface of the second insulating layer 212. Here, the second chip pads 216 may be arranged to form one column or to form a plurality of columns. For example, the second chip pads 216 may be arranged in a grid shape (i.e., in a plurality of columns and a plurality of rows) or in a honeycomb shape. In an example embodiment, the second chip pads 216 may be arranged to have at least two different pitches. For example, the arrangement of the second chip pads 216 may be variously changed depending on an integration density and positions of the interconnection lines in the second semiconductor chip 200. The second chip pads 216 may be formed of or include at least one of metallic materials (e.g., aluminum (Al) and copper (Cu)).

The second chip pads 216 may include power pads 2161, signal pads 2162, and dummy pads 2163. The power pads 2161 and the signal pads 2162 may be overlapped with the interconnection substrate 300. For example, the power pads 2161 and the signal pads 2162 may be placed on a top surface of the interconnection substrate 300. The power pads 2161 may correspond to the power terminals P1 described with reference to FIGS. 1A and 1B. The power pads 2161 may be used as an electric connection path between the voltage generating circuit VGC (e.g., see FIG. 1A) and an external device. At least one of the power pads 2161 may be electrically connected to the passive device 350. At least one of the power pads 2161 may be grounded through the package substrate 10. The signal pads 2162 may correspond to the signal terminals P2 described with reference to FIGS. 1A and 1B. The signal pads 2162 may be used as an electric connection path between the internal circuit ITC (e.g., see FIG. 1A) and the external device. The signal pads 2162 may be electrically disconnected from the passive device 350.

The dummy pads 2163 may be overlapped with the first semiconductor chip 100. For example, the dummy pads 2163 may be placed on the top surface 100u of the first semiconductor chip 100. The dummy pads 2163 may not be connected to the second integrated circuit 202.

Referring back to FIGS. 2 and 3, the second chip passivation layer 213 may be provided on the bottom surface of the second insulating layer 212. The second chip passivation layer 213 may be provided on the bottom surface of the second insulating layer 212 to be disposed on and cover the second chip pads 216, but the second chip passivation layer 213 may have openings, which are formed to at least partially expose surfaces of the second chip pads 216. The second chip passivation layer 213 may be formed of or include a photosensitive polymer (e.g., a photosensitive polyimide).

Third solder patterns 43 may be provided between the interconnection substrate 300 and the second semiconductor chip 200. The third solder patterns 43 may electrically connect the second chip pads 216 of the second semiconductor chip 200 to the second connection pads 326 of the interconnection substrate 300.

Fourth solder patterns 44 may be provided between the first semiconductor chip 100 and the second semiconductor chip 200. The fourth solder patterns 44 may be attached to a bottom surface of the dummy pad 2163 and may be in direct contact with the top surface 100u of the first semiconductor chip 100. The fourth solder patterns 44, along with the third solder patterns 43, may be used to support the second semiconductor chip 200. The third solder patterns 43 and the fourth solder patterns 44 may include solder balls or solder bumps.

A mold layer 50 may be provided on the top surface of the package substrate 10. The mold layer 50 may be disposed on and cover the first semiconductor chip 100, the second semiconductor chip 200, and the interconnection substrate 300. The mold layer 50 may be formed of or include an insulating polymer, such as epoxy molding compound (EMC).

Figure 6:
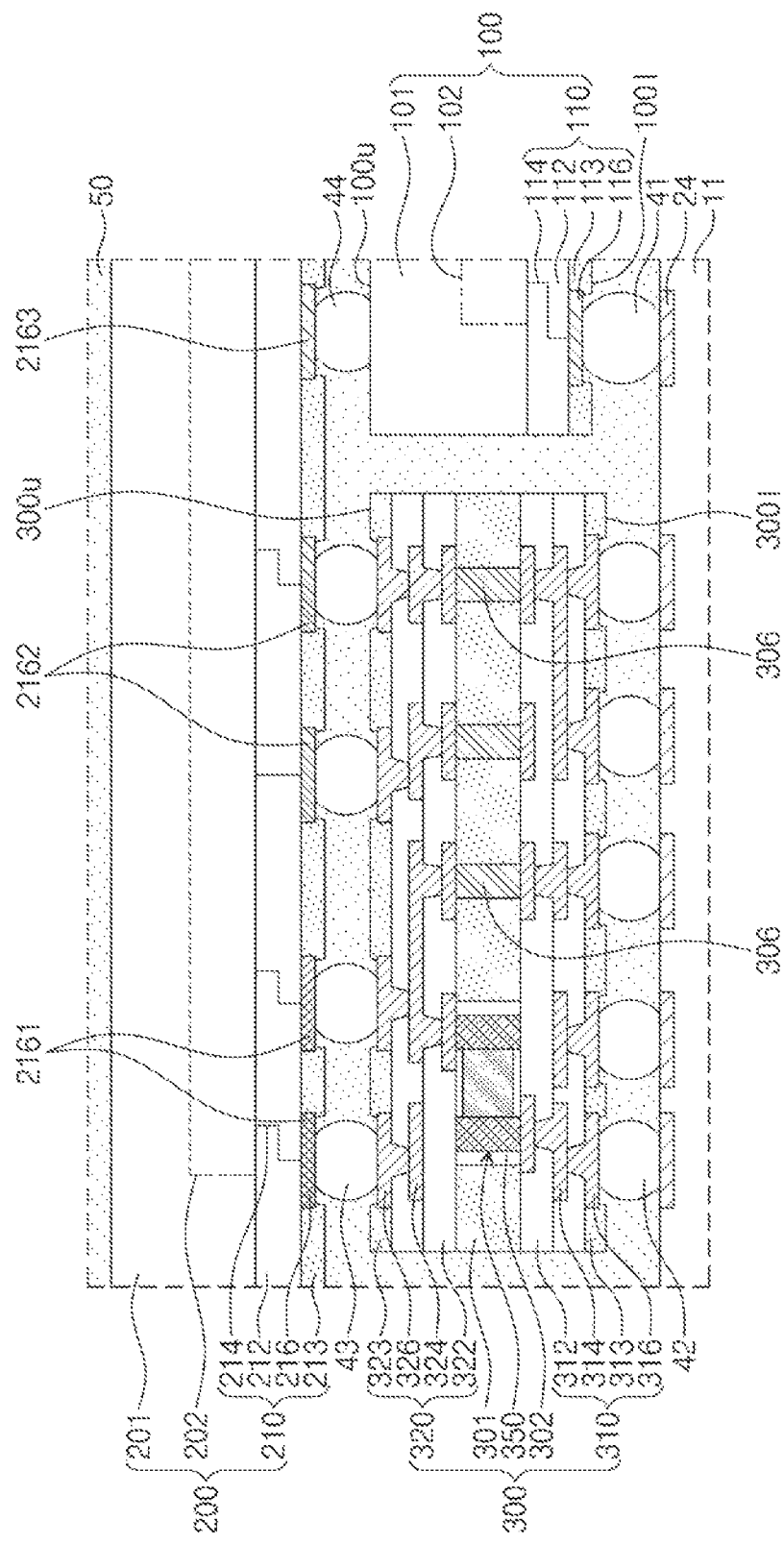
FIGS. 6, 7, and 8 are enlarged sectional views, each of which illustrates a portion of a semiconductor package according to an example embodiment.
Figure 7:
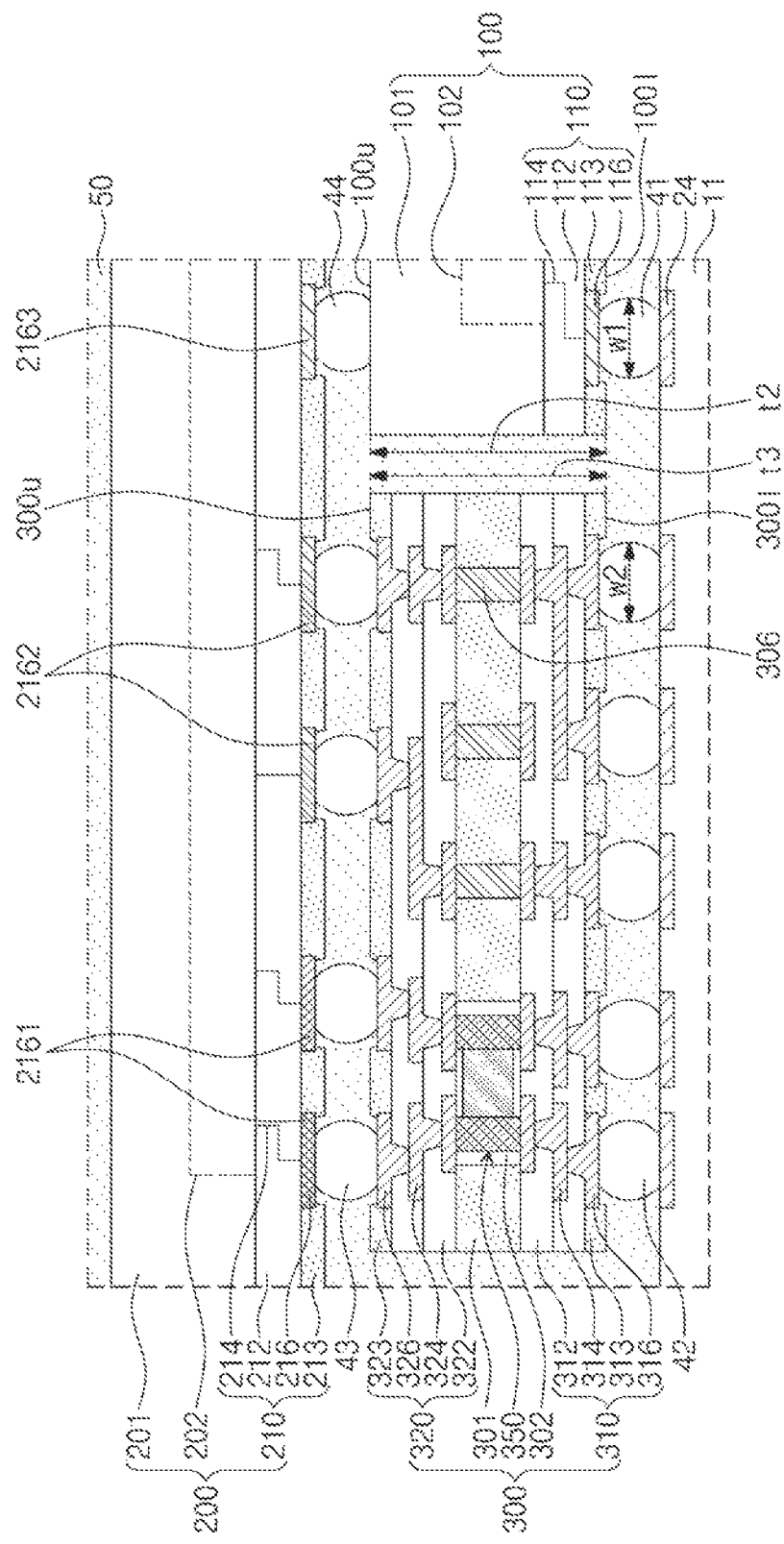
Figure 8:
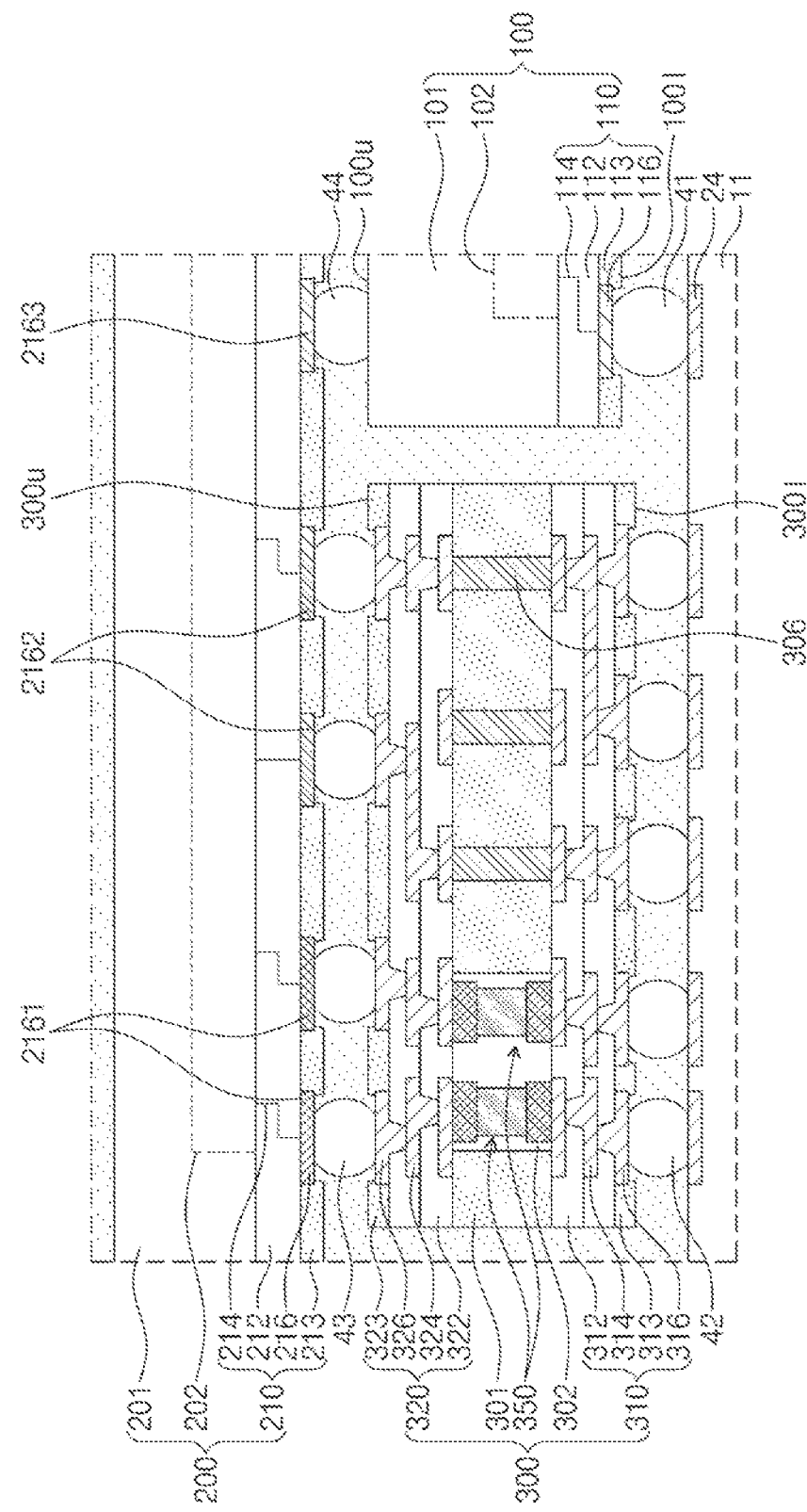

FIGS. 6 to 8 are enlarged sectional views, each of which illustrates a portion of a semiconductor package according to an example embodiment. Hereinafter, for concise description, a previously described element may be identified by the same reference number without repeating an overlapping description thereof.

Referring to FIGS. 5 and 6, the passive device 350 may be electrically connected to the first connection pad 316 through the upper interconnection pattern 324. The first connection pad 316, which is connected to the passive device 350 through the upper interconnection pattern 324, may be grounded through the package substrate 10. One of the electrodes EL1 and EL2 of the passive device 350 may be electrically disconnected from the upper interconnection pattern 324. Another of the electrodes EL1 and EL2 of the passive device 350 may be electrically disconnected from the lower interconnection pattern 314.

Referring to FIG. 7, the thickness t3 of the interconnection substrate 300 may be equal to the thickness t2 of the first semiconductor chip 100. The top surface 300u of the interconnection substrate 300 may be located at the same level as the top surface 100u of the first semiconductor chip 100. The bottom surface 300l of the interconnection substrate 300 may be located at the same level as the bottom surface 100l of the first semiconductor chip 100. The width w1 of the first solder patterns 41 may be equal to the width w2 of the second solder patterns 42.

Referring to FIGS. 5 and 8, the interconnection substrate 300 may include a plurality of passive devices 350. Each of the passive devices 350 may be disposed to stand and extend in a vertical direction, unlike that described with reference to FIG. 3. For example, one of the electrodes EL1 and EL2 of the passive device 350 may be connected to the lower interconnection pattern 314, and another of the electrodes EL1 and EL2 of the passive device 350 may be connected to the upper interconnection pattern 324.

Figure 9:
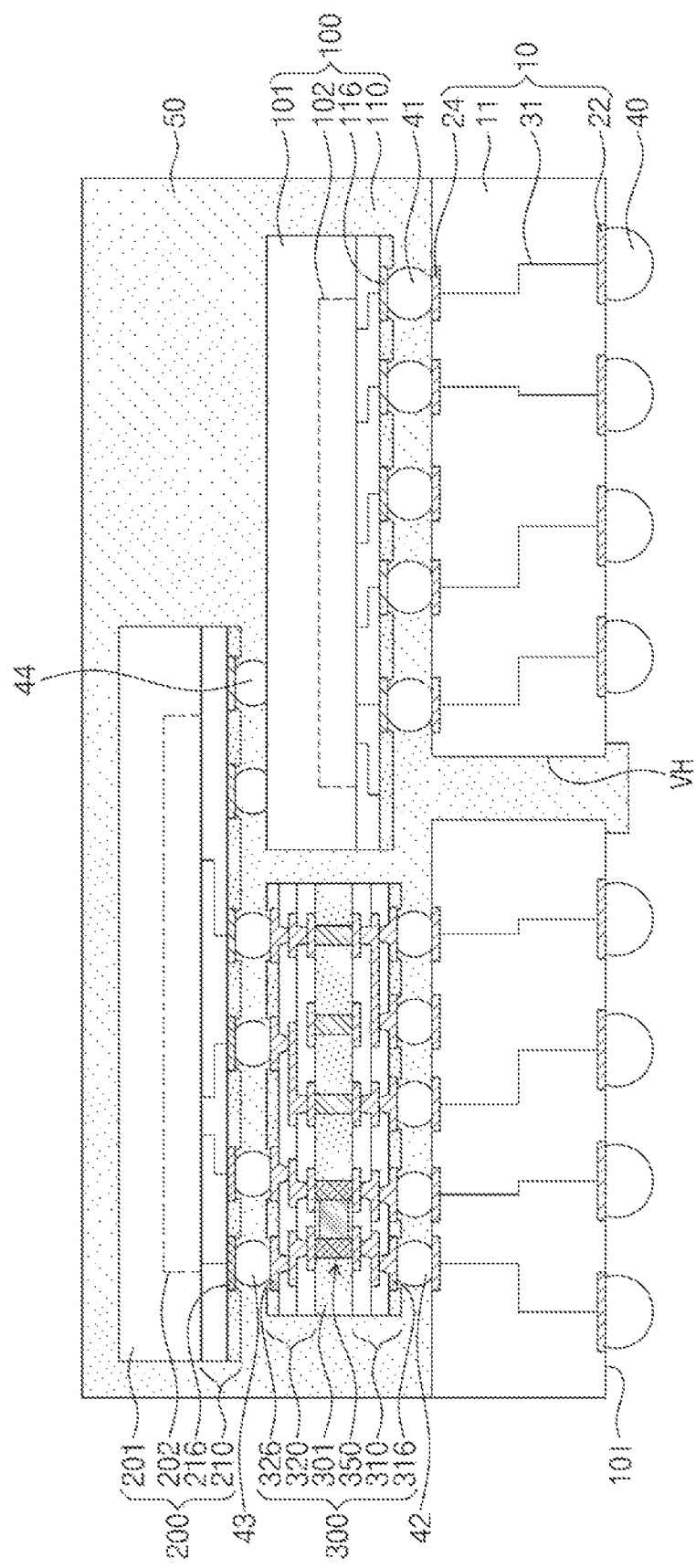
FIGS. 9 and 10 are sectional views, each of which illustrates a semiconductor package according to an example embodiment.
Figure 10:
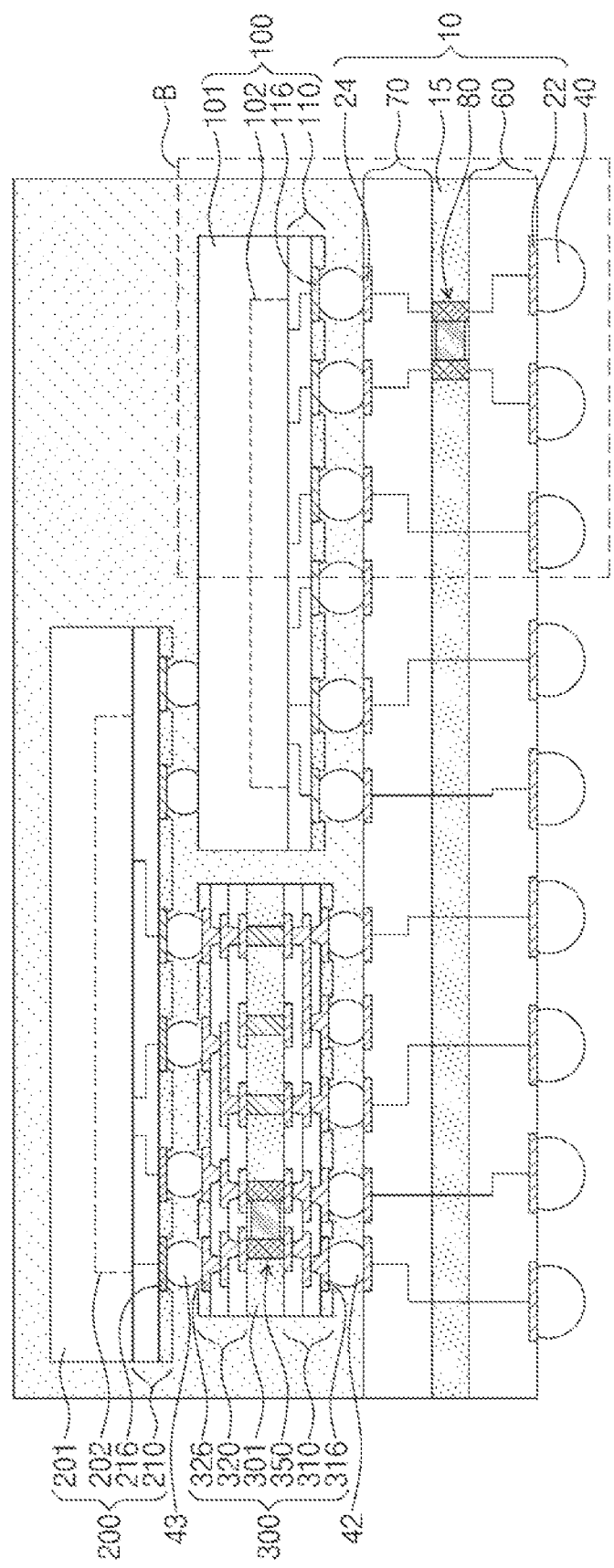

FIGS. 9 and 10 are sectional views, each of which illustrates a semiconductor package according to an example embodiment. For concise description, a previously described element may be identified by the same reference number without repeating an overlapping description thereof.

Referring to FIG. 9, the package substrate 10 may have a vent hole VH, which is formed to vertically penetrate the package substrate 10. The vent hole VH may be located on a center portion of the package substrate 10. The mold layer 50 may be provided to fill an inner portion of the vent hole VH. The mold layer 50 may be extended from the inner portion of the vent hole VH to be disposed on and cover at least a portion of a bottom surface of the package substrate 10.

Figure 11:
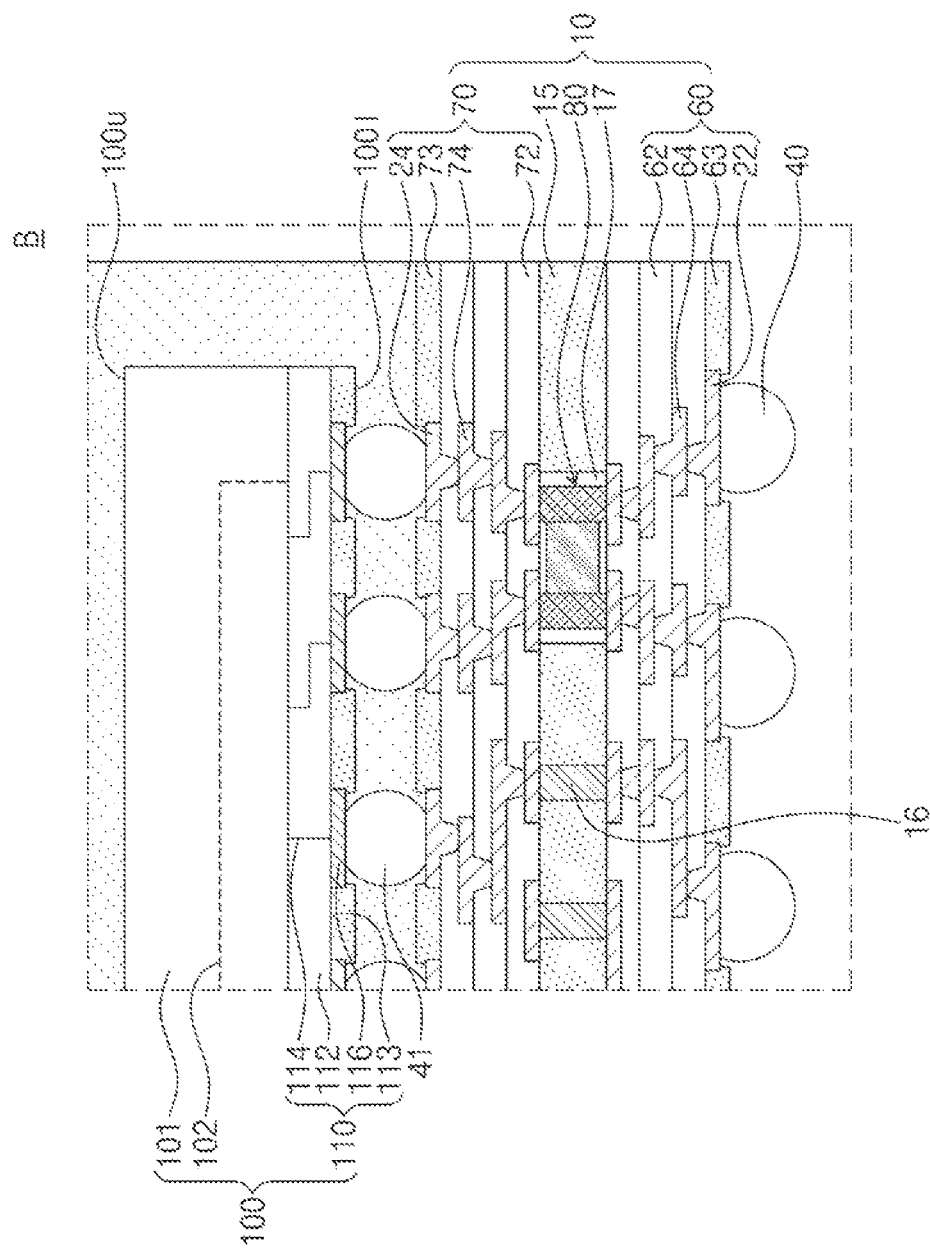
FIG. 11 is an enlarged sectional view illustrating a portion B of FIG. 10.

FIG. 11 is an enlarged sectional view illustrating a portion B of FIG. 10. For concise description, a previously described element may be identified by the same reference number without repeating an overlapping description thereof.

Referring to FIGS. 10 and 11, the package substrate 10 may include a lower passive device 80, which is electrically connected to the first semiconductor chip 100. For example, the package substrate 10 may include a lower substrate interconnection layer 60, a substrate core layer 17, the lower passive device 80, and an upper substrate interconnection layer 70. The substrate core layer 17 may be disposed between the lower substrate interconnection layer 60 and the upper substrate interconnection layer 70. The lower passive device 80 may be disposed in the substrate core layer 17 and may be electrically connected to the lower substrate interconnection layer 60 and the upper substrate interconnection layer 70.

The lower substrate interconnection layer 60 may include lower substrate insulating layers 62, a lower substrate passivation layer 63, a lower substrate interconnection pattern 64, and the outer pads 22. The lower substrate insulating layers 62 may be stacked on a bottom surface of the substrate core layer 17. The lower substrate insulating layers 62 may be integrally formed of or include the same material. The lower substrate insulating layers 62 may be formed of or include at least one of thermosetting resins (e.g., epoxy resin) or thermoplastic resins (e.g., polyimide). The lower substrate insulating layers 62 may further include a reinforcing material (e.g., a glass fiber and an inorganic filler). The reinforcing material may include, for example, prepreg, ABF, and so forth. In an example embodiment, the lower substrate insulating layers 62 may be formed of or include an organic material such as a photosensitive insulating or photo-imageable dielectric material. The photosensitive insulating material may be polymeric materials. For example, the photosensitive insulating material may include at least one of photosensitive polyimide, polybenzoxazole, phenol-based polymers, and benzocyclobutene-based polymers.

The lower substrate interconnection patterns 64 may be provided in the lower substrate insulating layer 62 and may be electrically connected to the lower passive device 80, which is disposed in the substrate core layer 17, and the lower conductive pillars 16. The lower substrate interconnection pattern 64 may be formed of or include at least one of metallic materials (e.g., copper (Cu)). The lower substrate interconnection pattern 64 may include horizontal line portions, which are disposed between the lower substrate insulating layers 62 to transmit electric signals in a horizontal direction, and via portions, which are used to transmit the electric signals between the horizontal line portions. The via portions may protrude from the horizontal line portions in a direction toward the substrate core layer 17.

The outer pads 22 may be horizontally arranged on a bottom surface of the lower substrate insulating layer 62. The outer pads 22 may be electrically connected to the lower substrate interconnection pattern 64 through the via portions.

The lower substrate passivation layer 63 may be provided on the bottom surface of the lower substrate insulating layer 62. The lower substrate passivation layer 63 may be provided on the bottom surface of the lower substrate insulating layer 62 to be disposed on and cover the outer pads 22, but the lower substrate passivation layer 63 may have openings, which are formed to at least partially expose surfaces of the outer pads 22. The lower substrate passivation layer 63 may be formed of or include at least one of ABF, solder resist, and a photosensitive polymer (e.g., a photosensitive polyimide).

The substrate core layer 17 may be disposed on a top surface of the lower substrate insulating layer 62. The substrate core layer 17 may be formed of or include at least one of insulating materials. The substrate core layer 17 may have a thickness larger than each of the lower and upper substrate insulating layers 62 and 72. The substrate core layer 17 may be formed of or include at least one of thermosetting resins (e.g., epoxy resin) or thermoplastic resins (e.g., polyimide). The substrate core layer 17 may further include a reinforcing material (e.g., a glass fiber and an inorganic filler). The reinforcing material may be formed of or include, for example, prepreg and Ajinomoto build-up film (ABF). The substrate core layer 17 may include one of, for example, a ceramic plate, a liquid crystal polymer (LCP), a glass plate, a copper clad laminate (CCL), or an unclad CCL. In an example embodiment, the substrate core layer 17 may be formed of or include a material that is different from the lower substrate insulating layers 62 and the upper substrate insulating layers 72.

The upper substrate interconnection layer 70 may be disposed on a top surface of the substrate core layer 17. The upper substrate interconnection layer 70 may include the upper substrate insulating layers 72, an upper substrate passivation layer 73, an upper substrate interconnection pattern 74, and the upper pads 24. The upper substrate insulating layers 72 may be stacked on the top surface of the substrate core layer 17. The upper substrate insulating layers 72 may be integrally formed of or include the same material. The upper substrate insulating layers 72 may be formed of or include at least one of thermosetting resins (e.g., epoxy resin) or thermoplastic resins (e.g., polyimide). The upper substrate insulating layers 72 may further include a reinforcing material (e.g., a glass fiber and an inorganic filler). The reinforcing material may include, for example, prepreg, ABF, and so forth. In an example embodiment, and the upper substrate insulating layers 72 may be formed of or include an organic material such as a photosensitive insulating or photo-imageable dielectric material. The photosensitive insulating material may be polymeric materials. For example, the photosensitive insulating material may include at least one of photosensitive polyimide, polybenzoxazole, phenol-based polymers, and benzocyclobutene-based polymers.

The upper interconnection patterns 324 may be provided in the upper substrate insulating layer 72 and may be electrically connected to the lower passive device 80, which is disposed in the substrate core layer 17, and the lower conductive pillars 16. The upper substrate interconnection pattern 74 may be formed of or include a metallic material (e.g., copper (Cu)). The upper substrate interconnection pattern 74 may include horizontal line portions, which are disposed between the upper substrate insulating layers 72 to transmit electric signals in a horizontal direction, and via portions, which are used to transmit the electric signals between the horizontal line portions. The via portions may protrude from the horizontal line portions in a direction toward the substrate core layer 17.

The upper pads 24 may be horizontally arranged on a top surface of the upper substrate insulating layer 72. The upper pads 24 may be electrically connected to the upper substrate interconnection pattern 74 through the via portions. The upper pads 24 may be arranged to form one column or to form a plurality of columns. The upper pads 24 may be formed of or include at least one of metallic materials (e.g., copper (Cu)).

The upper substrate passivation layer 73 may be provided on the top surfaces of the upper substrate insulating layers 72. The upper substrate passivation layer 73 may be provided on the top surfaces of the upper substrate insulating layers 72 to be disposed on and cover the upper pads 24, and the upper substrate passivation layer 73 may have openings, which are formed to at least partially expose surfaces of the upper pads 24. The upper substrate passivation layer 73 may be formed of or include at least one of ABF, solder resist, and a photosensitive polymer (e.g., a photosensitive polyimide).

The lower passive device 80 may be disposed in a hole which is formed to vertically penetrate the substrate core layer 17. The lower passive device 80 may be electrically connected to the outer pad 22 through the lower substrate interconnection pattern 64 and may be electrically connected to the upper pad 24 through the upper substrate interconnection pattern 74.

Figure 12:
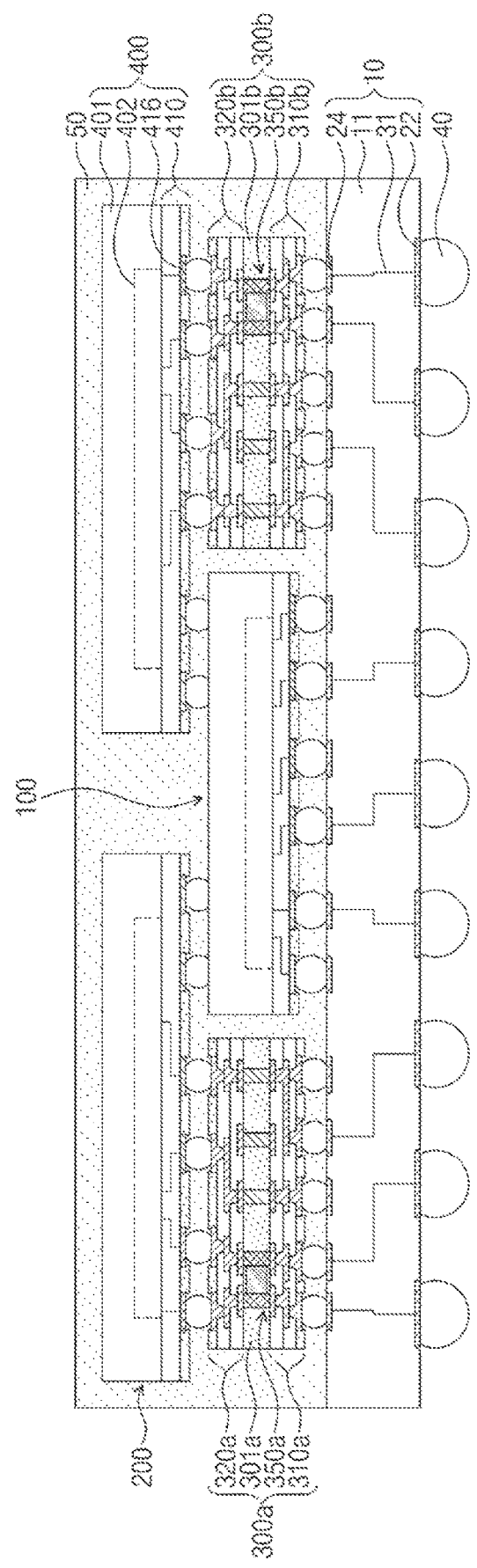
FIG. 12 is a sectional view illustrating a semiconductor package according to an example embodiment.
Figure 13:
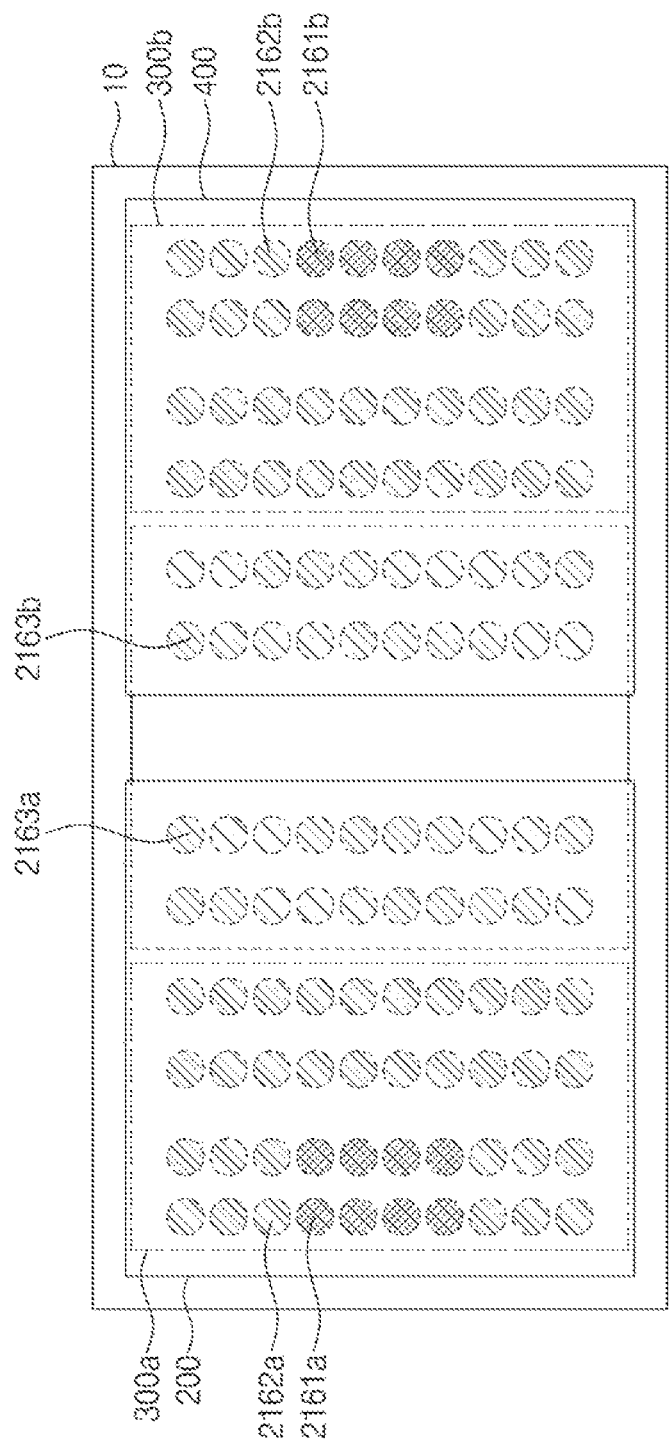
FIG. 13 is a plan view illustrating a semiconductor package according to an example embodiment.

FIG. 12 is a sectional view illustrating a semiconductor package according to an example embodiment. FIG. 13 is a plan view illustrating a semiconductor package according to an example embodiment. For concise description, a previously described element may be identified by the same reference number without repeating an overlapping description thereof.

Referring to FIGS. 12 and 13, a semiconductor package according to an example embodiment may include a third semiconductor chip 400 and a second interconnection substrate 300b, which is provided between the third semiconductor chip 400 and the package substrate 10. In the example embodiment, the interconnection substrate 300 described with reference to FIGS. 2 and 3 may be referred to as a first interconnection substrate 300a.

The second interconnection substrate 300b may have a side surface facing the first semiconductor chip 100. The second interconnection substrate 300b may be horizontally spaced apart from the first interconnection substrate 300a, with the first semiconductor chip 100 interposed therebetween. For example, the first semiconductor chip 100 may be placed between the side surface of the first interconnection substrate 300a and the side surface of the second interconnection substrate 300b. The second interconnection substrate 300b may include a second lower interconnection layer 310b, a second core layer 301b, a second upper interconnection layer 320b, and a second passive device 350b in the second core layer 301b. Elements included in the second interconnection substrate 300b may be similar to elements included in the first interconnection substrate 300a described above.

The third semiconductor chip 400 may be mounted on a top surface of the second interconnection substrate 300b. The third semiconductor chip 400 may be partially overlapped with the first semiconductor chip 100. The third semiconductor chip 400 may be electrically connected to the package substrate 10 through the second interconnection substrate 300b. The third semiconductor chip 400 may include a third base layer 401, in which a third integrated circuit 402 is formed, and a third chip interconnection layer 410, which is connected to the third integrated circuit 402. Elements included in the third semiconductor chip 400 may be similar to elements included in the second semiconductor chip 200 described above. For example, the third integrated circuit 402 of the third semiconductor chip 400 may include a voltage generating circuit and an internal circuit, and the voltage generating circuit of the third semiconductor chip 400 may be electrically connected to the second passive device 350b to improve power integrity of the semiconductor package.

The third semiconductor chip 400 may include a second power pad 2161b connected to the voltage generating circuit, a second signal pad 2162b connected to the internal circuit, and a second dummy pad 2163b electrically disconnected from the third integrated circuit 402. The second power pad 2161b and the second signal pad 2162b may be overlapped with the second interconnection substrate 300b. The second dummy pad 2163b may be overlapped with the first semiconductor chip 100. Since the first semiconductor chip 100 and the third semiconductor chip 400 are overlapped with each other, it may be possible to reduce an area of the top surface of the package substrate 10, which is occupied by the semiconductor chips 100, 200, and 400, and to reduce a size of the semiconductor package.

In a semiconductor package according to an example embodiment, semiconductor chips may be disposed to be overlapped with each other, and thus, it may be possible to reduce a planar area occupied by the semiconductor chips and to reduce a size of the semiconductor package.

At least one of the semiconductor chips may be connected to a package substrate through an interconnection substrate, which includes a passive device, which may improve power integrity of the semiconductor package.

While example embodiments have been particularly shown and described, it will be understood by one of ordinary skill in the art that variations in form and detail may be made therein without departing from the spirit and scope of the attached claims and their equivalents.

What is claimed is:

1. A semiconductor package, comprising:
a first semiconductor chip provided on a package substrate;
an interconnection substrate provided on the package substrate, the interconnection substrate having a side surface facing the first semiconductor chip; and
a second semiconductor chip provided on the interconnection substrate and extended to a region on a top surface of the first semiconductor chip,
wherein the interconnection substrate comprises a lower interconnection layer facing the package substrate, an upper interconnection layer facing the first semiconductor chip, and a passive device between the lower interconnection layer and the upper interconnection layer, and
wherein the passive device is electrically connected to the second semiconductor chip.

2. The semiconductor package of claim 1, wherein a thickness of the interconnection substrate is larger than or equal to a thickness of the first semiconductor chip.

3. The semiconductor package of claim 1, wherein a bottom surface of the interconnection substrate is provided at a level lower than a bottom surface of the first semiconductor chip, and
wherein a difference between the level of the bottom surface of the interconnection substrate and the level of the bottom surface of the first semiconductor chip ranges from 0.1 μm to 10 μm.

4. The semiconductor package of claim 1, wherein the interconnection substrate comprises a core layer, which includes the passive device, and a conductive pillar, which is provided to penetrate the core layer and to connect the upper interconnection layer to the lower interconnection layer.

5. The semiconductor package of claim 1, wherein the second semiconductor chip comprises power pads and signal pads, which are provided on a bottom surface of the second semiconductor chip and are electrically connected to the package substrate, and
wherein the passive device is electrically connected to the power pads.

6. The semiconductor package of claim 1, wherein a thickness of the passive device is 0.05 to 0.3 times a thickness of the interconnection substrate.

7. The semiconductor package of claim 1, wherein the passive device comprises a first electrode, a second electrode, and a dielectric material between the first electrode and the second electrode.

8. The semiconductor package of claim 7, wherein the first electrode is electrically connected to the package substrate and the second semiconductor chip.

9. The semiconductor package of claim 7, wherein the second semiconductor chip comprises a first pad and a second pad, which are provided on a bottom surface of the second semiconductor chip,
wherein the first electrode is electrically connected to the first pad, and wherein the second electrode is electrically connected to the second pad.

10. The semiconductor package of claim 1, further comprising:
a first solder pattern between the interconnection substrate and the package substrate; and
a second solder pattern between the first semiconductor chip and the package substrate,
wherein a width of the second solder pattern is larger than a width of the first solder pattern.

11. The semiconductor package of claim 1, further comprising a third solder pattern between the top surface of the first semiconductor chip and a bottom surface of the second semiconductor chip,
wherein the third solder pattern is electrically disconnected from an integrated circuit in the first semiconductor chip.

12. A semiconductor package, comprising:
a package substrate having a top surface;
an upper pad provided on the top surface of the package substrate;
a first semiconductor chip provided on the top surface of the package substrate;
a second semiconductor chip provided on a top surface of the first semiconductor chip;
a chip pad is provided on the bottom surface of the second semiconductor chip; and
an interconnection substrate having a first surface facing the upper pad and a second surface facing the chip pad,
wherein the interconnection substrate comprises a passive device between the first surface and the second surface, and
wherein the passive device comprises a first electrode electrically connected to the upper pad, a second electrode electrically connected to the chip pad, and a dielectric material between the first electrode and the second electrode.

13. The semiconductor package of claim 12, wherein the first electrode is electrically connected to the second semiconductor chip.

14. The semiconductor package of claim 12, wherein a thickness of the interconnection substrate is larger than or equal to a thickness of the first semiconductor chip.

15. The semiconductor package of claim 12, wherein a top surface of the interconnection substrate and the top surface of the first semiconductor chip are provided at the same vertical level.

16. The semiconductor package of claim 12, wherein a thickness of the passive device is 0.05 to 0.3 times a thickness of the interconnection substrate.

17. A semiconductor package, comprising:
a package substrate having a bottom surface and a top surface;
outer pads provided on the bottom surface of the package substrate;
upper pads provided on the top surface of the package substrate;
a first semiconductor chip having first chip pads which are provided to face the upper pads;
first solder patterns between the upper pads and the first chip pads;
an interconnection substrate comprising:
a lower interconnection layer comprising first connection pads facing the upper pads;
a core layer provided on the lower interconnection layer and comprising a passive device; and
an upper interconnection layer provided on the core layer and comprising second connection pads;
second solder patterns between the upper pads and the first connection pads;
a second semiconductor chip comprising second chip pads, which are provided to face the second connection pads, and dummy pads, which are provided to face a top surface of the first semiconductor chip;
third solder patterns between the second connection pads and the second chip pads;
fourth solder patterns between the dummy pads and a top surface of the second semiconductor chip; and
a mold layer provided on the top surface of the package substrate and provided on the first semiconductor chip, the interconnection substrate, and the second semiconductor chip,
wherein the passive device is electrically connected to the second chip pads.

18. The semiconductor package of claim 17, further comprising a lower passive device between the bottom surface of the package substrate and the top surface of the package substrate.

19. The semiconductor package of claim 17, further comprising:
a second interconnection substrate provided on the package substrate and comprising a second passive device; and
a third semiconductor chip provided on the second interconnection substrate and on the top surface of the first semiconductor chip.

20. The semiconductor package of claim 17, wherein the second chip pads comprise power pads and signal pads, which are electrically connected to the package substrate, and
the passive device is electrically connected to the power pads.

* * * * *